United States Patent
Lin

(10) Patent No.: US 12,239,003 B2
(45) Date of Patent: Feb. 25, 2025

(54) DISPLAY PANEL AND MANUFACTURING METHOD THEREOF

(71) Applicant: SHENZHEN CHINA STAR OPTOELECTRONICS SEMICONDUCTOR DISPLAY TECHNOLOGY CO., LTD., Guangdong (CN)

(72) Inventor: Gaobo Lin, Guangdong (CN)

(73) Assignee: SHENZHEN CHINA STAR OPTOELECTRONICS SEMICONDUCTOR DISPLAY TECHNOLOGY CO., LTD., Guangdong (CN)

( * ) Notice: Subject to any disclaimer, the term of this patent is extended or adjusted under 35 U.S.C. 154(b) by 0 days.

(21) Appl. No.: 17/618,469

(22) PCT Filed: Nov. 23, 2021

(86) PCT No.: PCT/CN2021/132541
§ 371 (c)(1),
(2) Date: Dec. 11, 2021

(87) PCT Pub. No.: WO2023/087335
PCT Pub. Date: May 25, 2023

(65) Prior Publication Data
US 2024/0016030 A1   Jan. 11, 2024

(30) Foreign Application Priority Data
Nov. 16, 2021   (CN) .......................... 202111357202.8

(51) Int. Cl.
*H10K 59/80* (2023.01)
*H10K 59/12* (2023.01)
(Continued)

(52) U.S. Cl.
CPC ... *H10K 59/80518* (2023.02); *H10K 59/1201* (2023.02); *H10K 59/122* (2023.02);
(Continued)

(58) Field of Classification Search
CPC ......... H10K 59/80518; H10K 59/1201; H10K 59/8792; H10K 59/124; H10K 59/122;
(Continued)

(56) References Cited

U.S. PATENT DOCUMENTS 11,217,640 B2 *  1/2022  Jung ................... H10K 50/814
11,937,463 B2 *  3/2024  Takayama ........ H10K 59/80521
(Continued)

FOREIGN PATENT DOCUMENTS

CN   109599502 A   4/2019
CN   110911461 A   3/2020
(Continued)

OTHER PUBLICATIONS

International Search Report in International application No. PCT/CN2021/132541, mailed on Mar. 28, 2022.
(Continued)

*Primary Examiner* — Mouloucoulaye Inoussa
(74) *Attorney, Agent, or Firm* — PV IP PC; Wei Te Chung

(57) ABSTRACT

A display panel and a manufacturing method thereof are provided. A driving circuit layer includes an auxiliary electrode and an undercut structure. An undercut space is defined on the undercut structure. The auxiliary electrode includes a connection portion. The connection portion extends along a peripheral direction of the undercut structure. The connection portion is exposed by the undercut space. A light-emitting layer and a second electrode are cut at where the undercut structure is. The second electrode is connected to the connection portion of the auxiliary electrode. An encap-
(Continued)

sulation layer extends into the undercut space and covers the second electrode.

6 Claims, 8 Drawing Sheets

(51) Int. Cl.
*H10K 59/122* (2023.01)
*H10K 59/124* (2023.01)
*H10K 59/131* (2023.01)

(52) U.S. Cl.
CPC ......... *H10K 59/124* (2023.02); *H10K 59/131* (2023.02); *H10K 59/873* (2023.02); *H10K 59/8792* (2023.02)

(58) Field of Classification Search
CPC ............. H10K 59/126; H10K 59/1315; H10K 59/873; H10K 59/131; H10K 59/80522; H10K 59/80; H10K 50/814; H10K 59/80516; H10K 50/824; H10K 59/1213; H10K 59/121; H10K 59/173; H10K 50/11; H10K 50/8426; H10K 50/844; H10K 59/1275; H10K 59/38; H10K 50/816; H10K 50/828; H10K 59/123; H10K 59/878; H10K 50/84; H10K 2102/3026; G09G 3/3291; G09G 2310/08; G02B 5/3083; G02B 5/003; G06F 1/1637; G06F 1/1605; H10N 30/20; H10N 30/857

See application file for complete search history.

(56) References Cited

U.S. PATENT DOCUMENTS

| | | | |
|---|---|---|---|
| 2007/0296882 A1 | 12/2007 | Huang | |
| 2012/0205678 A1* | 8/2012 | Ikeda | H10K 50/814 438/22 |
| 2014/0183479 A1* | 7/2014 | Park | H10K 71/00 438/34 |
| 2014/0183501 A1* | 7/2014 | Kim | H10K 59/1315 438/34 |
| 2014/0312323 A1* | 10/2014 | Park | H10K 59/80522 438/23 |
| 2015/0001507 A1* | 1/2015 | Kim | H10K 59/1315 438/34 |
| 2015/0097171 A1* | 4/2015 | Kim | H10K 59/80524 438/23 |
| 2015/0179719 A1* | 6/2015 | Nam | H10K 50/814 438/4 |
| 2016/0043341 A1 | 2/2016 | Heo | |
| 2016/0149155 A1* | 5/2016 | Kim | H10K 59/124 438/23 |
| 2016/0149156 A1* | 5/2016 | Kim | H10K 59/80522 438/46 |
| 2017/0133620 A1* | 5/2017 | Lee | H10K 71/00 |
| 2017/0141176 A1* | 5/2017 | Im | H10K 59/80522 |
| 2017/0170246 A1* | 6/2017 | Im | H10K 59/80522 |
| 2017/0179208 A1* | 6/2017 | Jang | H10K 50/824 |
| 2017/0194415 A1* | 7/2017 | Choi | H10K 77/10 |
| 2018/0123088 A1* | 5/2018 | Kim | H10K 71/00 |
| 2018/0190944 A1* | 7/2018 | Lee | H10K 50/865 |
| 2018/0212007 A1* | 7/2018 | Lee | H10K 59/131 |
| 2019/0088730 A1* | 3/2019 | Lee | H10K 50/824 |
| 2019/0097161 A1* | 3/2019 | Im | H10K 50/805 |
| 2019/0131365 A1* | 5/2019 | Jung | H10K 50/844 |
| 2019/0140039 A1* | 5/2019 | Lee | H10K 59/173 |
| 2019/0165064 A1* | 5/2019 | Lee | H10K 59/80524 |
| 2019/0165305 A1* | 5/2019 | Zhang | H10K 59/80521 |
| 2020/0203469 A1* | 6/2020 | Li | H10K 59/122 |
| 2020/0303469 A1* | 9/2020 | Lee | H10K 71/00 |
| 2021/0202890 A1* | 7/2021 | Kim | G02B 5/3083 |
| 2021/0210571 A1* | 7/2021 | Zhang | H10K 50/824 |
| 2021/0336189 A1* | 10/2021 | Li | H10K 59/1315 |

FOREIGN PATENT DOCUMENTS

| | | |
|---|---|---|
| CN | 111211243 A | 5/2020 |
| CN | 111969034 A | 11/2020 |
| CN | 113097408 A | 7/2021 |
| CN | 113097412 A | 7/2021 |
| CN | 113488514 A | 10/2021 |
| CN | 113497089 A | 10/2021 |

OTHER PUBLICATIONS

Written Opinion of the International Search Authority in International application No. PCT/CN2021/132541, mailed on Mar. 28, 2022.
Chinese Office Action issued in corresponding Chinese Patent Application No. 202111357202.8 dated Oct. 14, 2022, pp. 1-12.

* cited by examiner

DISPLAY PANEL AND MANUFACTURING METHOD THEREOF

BACKGROUND OF INVENTION

Field of Invention

The present application relates to a display technology field, and specifically relates to a display panel and manufacturing method thereof.

Description of Prior Art

Organic light-emitting diode (OLED) display panel structures include transparent anode layers, light-emitting layers, and metal cathode layers. In order to increase a transmittance of top emission, a thickness of the metal cathode layers is relatively thin, leading to large resistance and serious current voltage drop, and resulting in obvious uneven brightness of the display panels, which seriously affects display effect of OLED display devices. In order to remedy unevenness of the display brightness of the panels, auxiliary electrodes can be disposed to connect to the thin metal cathode layers.

As illustrated in FIG. 1, in processes of research and practice of the prior art, the inventor of the present application found that, a hole-type undercut structure Un is generally adopted to expose an auxiliary cathode 01 of one side in the prior art, and then a connection hole of a cathode 02 is used to expose the auxiliary cathode 01. However, when an encapsulation layer 03 is formed on the basis of the hole-type undercut structure, cracks are prone to appearing on the encapsulation layer 03 at a hole, which increases a risk of failed encapsulation.

SUMMARY OF INVENTION

Embodiments of the present application provide a display panel and a manufacturing method thereof, which can improve encapsulation effect.

One embodiment of the present application provides a display panel, including:
- a substrate;
- a driving circuit layer, wherein the driving circuit layer is disposed on the substrate, the driving circuit layer includes an auxiliary electrode and an undercut structure disposed on the auxiliary electrode, an undercut space is defined on the undercut structure, the auxiliary electrode includes a connection portion, the connection portion extends along a peripheral direction of the undercut structure, and the connection portion is exposed by the undercut space;
- a first electrode, wherein the first electrode is disposed on the driving circuit layer, the first electrode is a reflective electrode;
- a light-emitting layer and a second electrode, wherein the light-emitting layer is disposed on the first electrode, the second electrode is disposed on the light-emitting layer, the light-emitting layer and the second electrode are cut at where the undercut structure is, and the second electrode is connected to the connection portion of the auxiliary electrode; and
- an encapsulation layer, wherein the encapsulation layer covers the second electrode, and the encapsulation layer extends into the undercut space and covers the second electrode.

Optionally, in some embodiments of the present application, the undercut structure includes a support portion and a block portion, the auxiliary electrode further includes a carrier portion, and the connection portion is connected on a peripheral side of the carrier portion, the support portion is disposed on the carrier portion, the block portion includes a connection part and a hanged part connected to the connection part, the connection part is disposed on the support portion, the hanged part protrudes out from the support portion, and lateral surfaces of the hanged part and the support portion form the undercut space.

Optionally, in some embodiments of the present application, the undercut space extends along a peripheral direction of the support portion to form a ring shape.

Optionally, in some embodiments of the present application, a first opening is defined in the driving circuit layer, and the undercut structure is disposed in the first opening, a thickness of the second electrode gradually increases in a direction from the support portion toward a hole wall of the first opening in the undercut space.

Optionally, in some embodiments of the present application, the driving circuit layer includes a passivation layer disposed on the substrate and a planarization layer disposed on the passivation layer, the auxiliary electrode includes a peripheral portion, the peripheral portion is connected on a peripheral side of the connection portion, the passivation layer covers the peripheral portion, the first opening includes a first branch hole and a second branch hole communicated with each other, the first branch hole is defined in the passivation layer, the second branch hole is defined in the planarization layer, a hole wall of the second branch hole is located at a periphery of a hole wall of the first branch hole,
- a width of the connection portion is greater than or equal to 4 μm, and a distance from the block portion to the hole wall of the second branch hole is greater than or equal to 6 μm.

Optionally, in some embodiments of the present application, the driving circuit layer includes a light shielding layer, a first insulation layer, an active layer, a second insulation layer, a first metal layer, a third insulation layer, a second metal layer, and a wiring layer disposed on the substrate,
- the passivation layer is disposed on the second metal layer, the auxiliary electrode is formed in the second metal layer, the support portion is formed in the passivation layer, the block layer is formed in the wiring layer, and the planarization layer is disposed on the wiring layer.

One embodiment of the present application further relates to a display panel, including:
- a substrate;
- a driving circuit layer, wherein the driving circuit layer is disposed on the substrate, the driving circuit layer includes an auxiliary electrode and an undercut structure disposed on the auxiliary electrode, an undercut space is defined on the undercut structure, the auxiliary electrode includes a connection portion, the connection portion extends along a peripheral direction of the undercut structure, and the connection portion is exposed by the undercut space;
- a first electrode, wherein the first electrode is disposed on the driving circuit layer;
- a light-emitting layer and a second electrode, wherein the light-emitting layer is disposed on the first electrode, the second electrode is disposed on the light-emitting layer, the light-emitting layer and the second electrode are cut at where the undercut structure is, and the second electrode is connected to the connection portion of the auxiliary electrode; and an encapsulation layer, wherein the encapsulation layer covers the second electrode, and the encapsulation layer extends into the undercut space and covers the second electrode.

Optionally, in some embodiments of the present application, the undercut structure includes a support portion and a block portion, the auxiliary electrode further includes a carrier portion, and the connection portion is connected on a peripheral side of the carrier portion, the support portion is disposed on the carrier portion, the block portion includes a connection part and a hanged part connected to the connection part, the connection part is disposed on the support portion, the hanged part protrudes out from the support portion, and lateral surfaces of the hanged part and the support portion form the undercut space.

Optionally, in some embodiments of the present application, the undercut space extends along a peripheral direction of the support portion to form a ring shape.

Optionally, in some embodiments of the present application, a thickness of the second electrode gradually increases in a direction from the support portion toward a hole wall of the first opening in the undercut space.

Optionally, in some embodiments of the present application, the driving circuit layer includes a passivation layer disposed on the substrate and a planarization layer disposed on the passivation layer, the auxiliary electrode includes a peripheral portion, the peripheral portion is connected on a peripheral side of the connection portion, the passivation layer covers the peripheral portion, the first opening includes a first branch hole and a second branch hole communicated with each other, the first branch hole is defined in the passivation layer, the second branch hole is defined in the planarization layer, a hole wall of the second branch hole is located at a periphery of a hole wall of the first branch hole, a width of the connection portion is greater than or equal to 4 μm, and a distance from the block portion to the hole wall of the second branch hole is greater than or equal to 6 μm.

Optionally, in some embodiments of the present application, the driving circuit layer includes a light shielding layer, a first insulation layer, an active layer, a second insulation layer, a first metal layer, a third insulation layer, a second metal layer, and a wiring layer disposed on the substrate, the passivation layer is disposed on the second metal layer, the auxiliary electrode is formed in the second metal layer, the support portion is formed in the passivation layer, the block layer is formed in the wiring layer, and the planarization layer is disposed on the wiring layer.

Correspondingly, one embodiment of the present application further provides a manufacturing method of the display panel, which includes following steps:

forming a driving circuit layer on a substrate, wherein the driving circuit layer comprises an auxiliary electrode;

forming a first electrode on the driving circuit layer;

etching a part of the driving circuit layer to form an undercut structure disposed on the auxiliary electrode, wherein an undercut space is defined on the undercut structure, the auxiliary electrode includes a connection portion, the connection portion extends along a peripheral direction of the undercut structure, and the connection portion is exposed by the undercut space;

forming a light-emitting layer and a second electrode on the first electrode in sequence, wherein the light-emitting layer and the second electrode are cut at where the undercut structure is, and the second electrode is connected to the connection portion of the auxiliary electrode; and forming an encapsulation layer on the second electrode, the encapsulation layer extends into the undercut space and covers the second electrode.

Optionally, in some embodiments of the present application, forming the driving circuit layer on the substrate includes following steps:

forming the auxiliary electrode on the substrate, the auxiliary electrode further includes a carrier portion, and the connection portion is connected on a peripheral side of the carrier portion;

forming a passivation layer on the auxiliary electrode; and forming a block portion on the passivation layer.

Optionally, in some embodiments of the present application, etching the part of the driving circuit layer to form the undercut structure disposed on the auxiliary electrode includes:

forming a photoresist layer on the planarization layer, the photoresist layer covers a hole wall of the second branch hole and exposes part of the block portion and the passivation layer, etching the exposed passivation layer to form an undercut structure and a first branch hole, wherein an undercut structure comprises the block portion and a support portion formed in the passivation layer, the support portion is disposed on the carrier portion, the block portion includes a connection part and a hanged part connected to the connection part, the connection part is disposed on the support portion, the hanged part protrudes out from the support portion, and lateral surfaces of the hanged part and the support portion form the undercut space; and removing the photoresist layer.

Optionally, in some embodiments of the present application, the undercut space extends along a peripheral direction of the support portion to form a ring shape.

Optionally, in some embodiments of the present application, a thickness of the support portion ranges from 1400 angstroms to 5100 angstroms.

Optionally, in some embodiments of the present application, wherein forming a light-emitting device layer on the driving circuit layer includes following steps:

forming the pixel definition layer on the first electrode;

forming the light-emitting layer on the first electrode;

forming the second electrode on the light-emitting layer, wherein the second electrode extends into the undercut space, and a thickness of the second electrode gradually increases in a direction from the support portion toward a hole wall of the first opening in the undercut space.

Optionally, in some embodiments of the present application, a thickness of the light-emitting layer gradually increases in the direction from the support portion toward the hole wall of the first opening in the undercut space.

Optionally, in some embodiments of the present application, materials of the block portion and the wiring layer are same.

In the display panel and the manufacturing method thereof of the embodiments of the present application, the island-type undercut structure is adopted to replace a hole-type undercut structure in the prior art, thereby improving encapsulation effect of the display panel.

Specifically, the display panel includes the driving circuit layer, the light-emitting layer, the second electrode, and the encapsulation layer. The driving circuit layer includes the auxiliary electrode and the undercut structure disposed on the auxiliary electrode, The undercut space is defined on the undercut structure. The auxiliary electrode includes the connection portion. The connection portion extends along the peripheral direction of the undercut structure. The connection portion is exposed by the undercut space. The light-emitting layer and the second electrode are cut at where the undercut structure is. The second electrode is connected to the connection portion of the auxiliary electrode. The encapsulation layer extends into the undercut space and covers the second electrode. Because the encapsulation layer can extend into the undercut space and can cover the second electrode and the light-emitting layer in the undercut space, the encapsulation effect of the encapsulation layer is improved.

DESCRIPTION OF DRAWINGS

To more clearly illustrate the technical solutions of the embodiments of the present application, the accompanying figures of the present application will be described in brief. Obviously, the accompanying figures described below are only part of the embodiments of the present application, from which figures those skilled in the art can derive further figures without making any inventive efforts.

DETAILED DESCRIPTION OF EMBODIMENTS

Figure 1:
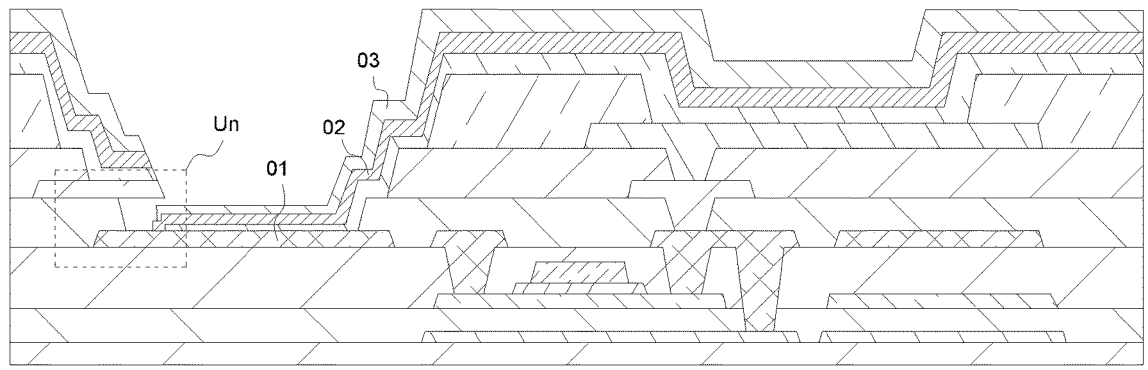
FIG. 1 is a schematic diagram of a display panel of the prior art.

The technical solutions in the embodiments of the present application are clearly and completely described in the following with reference to the accompanying drawings in the embodiments of the present application. Obviously, the described embodiments are only part of the embodiments of the present application, but are not all embodiments of the present application. All other embodiments obtained by those skilled in the art based on the embodiments of the present application without creative efforts are within the scope of the present application. Besides, it should be understood that the specific embodiments described herein are merely for describing and explaining the present application and are not intended to limit the present application. In the present application, unless opposite stated, the orientation words used such as "upper" and "lower" generally refer to the upper and lower directions of the device in actual using or working state, and specifically refer to the drawing directions in the drawings, and "inner" and "outer" refer to the outline of the device.

Embodiments of the present application provide a display panel and a manufacturing method thereof, and detailed descriptions are provided below. It should be noted that a description order of the following embodiments is not intended to limit a preferred order of the embodiments.

Figure 2:
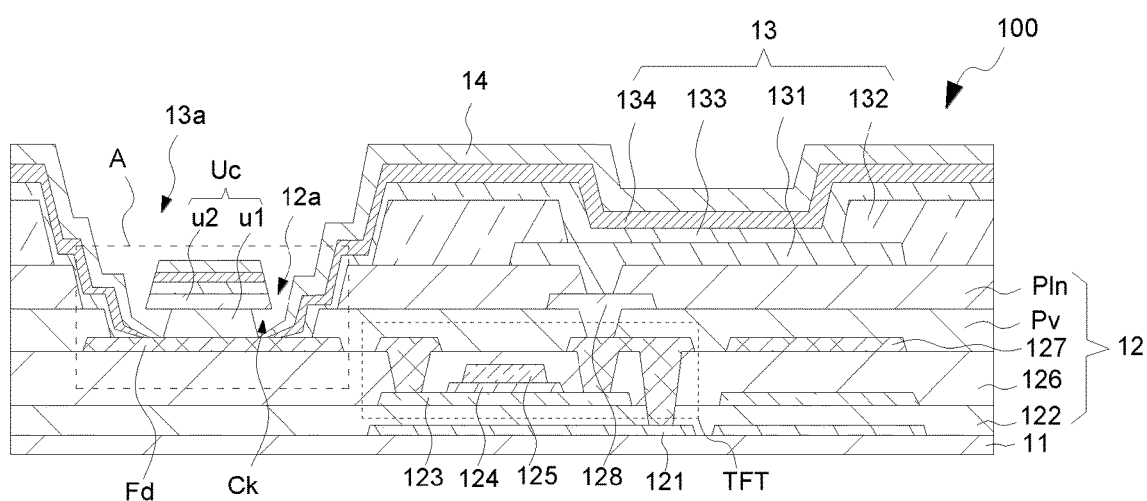
FIG. 2 is a structural schematic diagram of a display panel provided by one embodiment of the present application.
Figure 3:
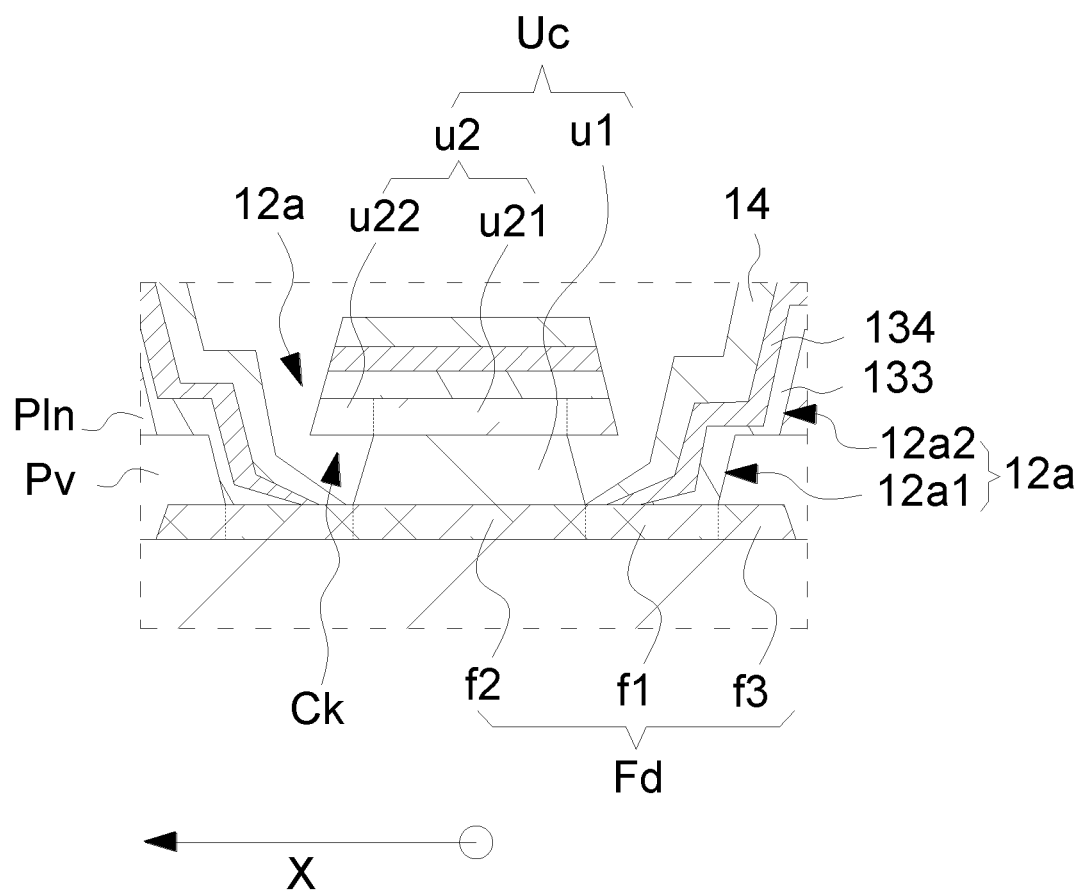
FIG. 3 is a schematic diagram of an enlargement of part A in FIG. 1.

Please refer to FIG. 2 and FIG. 3. One embodiment of the present application provides a display panel 100, which includes a substrate 11, a driving circuit layer 12, a light-emitting device layer 13, and an encapsulation layer 14.

The driving circuit layer 12 is disposed on the substrate 11. The driving circuit layer 12 includes an auxiliary electrode Fd and an undercut structure Uc disposed on the auxiliary electrode Fd. An undercut space Ck is defined on the undercut structure Uc. The auxiliary electrode Fd includes a connection portion f1. The connection portion f1 extends along a peripheral direction of the undercut structure Uc. The connection portion f1 is exposed by the undercut space Ck.

The light-emitting device layer 13 includes a first electrode 131, and a pixel definition layer 132, a light-emitting layer 133, and a second electrode 134 disposed on the first electrode 131. The first electrode 131 is disposed on the driving circuit layer 12.

The light-emitting layer 133 and the second electrode 134 are cut at where the undercut structure Uc is. The second electrode 134 is connected to the connection portion f1 of the auxiliary electrode Fd.

Wherein, a part of the light-emitting layer 133 and the second electrode 134 is disposed on the undercut structure Uc. The light-emitting layer 133 is disposed on the first electrode 131 and the pixel definition layer 132. The second electrode 134 is disposed on the light-emitting layer 133.

The encapsulation layer 14 covers the light-emitting device layer 13. Specifically, the encapsulation layer 14 covers the second electrode 134. The encapsulation layer 14 extends into the undercut space Ck and covers the second electrode 134.

In the display panel 100 of the embodiments of the present application, an island-type undercut structure is adopted to replace a hole-type undercut structure in the prior art. Specifically, as the undercut structure Uc is disposed at middle of the auxiliary electrode Fd, the undercut structure Uc is located in the opening, and a slope of the surrounding hole wall is continuous, the hole wall has no protrusion portion in the prior art. When the encapsulation layer 14 is manufactured, the encapsulation layer 14 can completely cover the whole hole wall, can extend into the undercut space Ck, and can cover the second electrode 134 and the light-emitting layer 133 in the undercut space Ck, thereby improving the encapsulation effect of the encapsulation layer 14. Therefore, the encapsulation effect of the display panel 100 is improved.

Optionally, please refer to FIG. 3, the undercut structure Uc includes a support portion u1 and a block portion u2. The auxiliary electrode Fd further includes a carrier portion f2. The connection portion f1 is connected to a peripheral side of the carrier portion f2. The support portion u1 is disposed on the carrier portion f2. The block portion u2 includes a connection part u21 and a hanged part u22 connected to the connection part u21. The connection part u21 is disposed on the support portion u1. The hanged part u22 protrudes out from the support portion u1. Lateral surfaces of the hanged part u22 and the support portion u1 form the undercut space Ck.

Wherein, because there is a space between the hanged part u22 and the hole wall of the first opening 12a, the space and the undercut space Ck cause the light-emitting layer 133 to be cut at the undercut structure Uc and to expose the auxiliary electrode Fd. Then, by adjusting an evaporation deposition angle of the second electrode 134, the second electrode 134 is made to connect to the auxiliary electrode Fd.

Optionally, the undercut space Ck extends along a peripheral direction of the support portion u1 to form a ring shape. In this way, the encapsulation effect of the encapsulation layer 14 is improved.

In some embodiments, undercut structure Ck can be disposed on opposite sides of the undercut structure Uc, i.e., the undercut space Ck extends along the two sides of the periphery of the support portion u1 to form two isolated undercut spaces Ck.

Optionally, a first opening 12a is defined in the driving circuit layer 12. The undercut structure Uc is disposed in the first opening 12a. A thickness of the second electrode 134 gradually increases in a direction X from the support portion u1 toward a hole wall of the first opening 12a in the undercut space Ck. In other words, as the second electrode 134 enters into the undercut space Ck deeper, the thickness of the second electrode 134 decreases, thereby facilitating the encapsulation layer 14 to enter a space deep in the undercut space Ck, and increasing a probability that the encapsulation layer 14 covers the second electrode 134.

Optionally, the encapsulation layer 14 covers the second electrode 134 located in the undercut space Ck, and the second electrode 134 covers the light-emitting layer 133 located in the undercut space Ck.

A thickness of the light-emitting layer 133 gradually increases in the direction X from the support portion u1 toward the hole wall of the first opening 12a in the undercut space Ck. In other words, as the light-emitting layer 133 enters into the undercut space Ck deeper, the thickness of the light-emitting layer 133 decreases, thereby facilitating the second electrode 134 to enter the space deep in the undercut space Ck, and increasing an area of the second electrode 134 connected to the auxiliary electrode Fd.

Optionally, the driving circuit layer 12 includes a passivation layer Pv disposed on the substrate 11 and a planarization layer Pln disposed on the passivation layer Pv. The auxiliary electrode Fd further includes a peripheral portion f3, and the peripheral portion f3 is connected on a peripheral side of the connection portion f1. The passivation layer Pv covers the peripheral portion f3. The first opening 12a includes a first branch hole 12a1 and a second branch hole 12a2 communicated with each other. The first branch hole 12a1 is defined in the passivation layer Pv. The second branch hole 12a2 is defined in the planarization layer Pln. A hole wall of the second branch hole 12a2 is located at a periphery of a hole wall of the first branch hole 12a1.

A width of the connection portion f1 is greater than or equal to 4 μm. A distance from the block portion u2 to the hole wall of the second branch hole 12a2 is greater than or equal to 6 μm.

Optionally, the width of the connection portion f1 can be 4 μm, 5 μm, 6 μm, 8 μm, or 10 μm, etc., and the distance from the block portion u2 to the hole wall of the second branch hole 12a2 can be 6 μm, 8 μm, 10 μm, 15 μm or 20 μm, etc.

Optionally, a thickness of the support portion u1 ranges from 1400 angstroms to 5100 angstroms, for example, 1400 angstroms, 1500 angstroms, 2000 angstroms, 2500 angstroms, 4000 angstroms, 5000 angstroms, or 5100 angstroms.

Optionally, the driving circuit layer 12 further includes a light shielding layer 121, a first insulation layer 122, an active layer 123, a second insulation layer 124, a first metal layer 125, a third insulation layer 126, a second metal layer 127, and a wiring layer 128 disposed on the substrate 11.

The passivation layer Pv is disposed on the second metal layer 127. The auxiliary electrode Fd is formed in the second metal layer 127. The support portion u1 is formed in the passivation layer Pv. The block layer u2 is formed in the wiring layer 128. The planarization layer Pln is disposed on the wiring layer 128.

The auxiliary electrode Fd is formed in the second metal layer 127. The support portion u1 is formed in the passivation layer Pv. The block layer u2 is formed in the wiring layer 128, which can achieve an effect of saving steps and processes.

In this embodiment, the first metal layer 125 includes a gate electrode. The second metal layer 127 further includes a source electrode and a drain electrode. The wiring layer 128 includes a conductive pad. A first part of the active layer 123, the gate electrode, the source electrode, and the drain electrode form a thin film transistor TFT. The conductive pad is connected to the source electrode of the thin film transistor TFT through a via hole. The source electrode is connected to a first part of a light shielding layer 121 by another via hole. The first part of the light shielding layer 121 shields the active layer 123. The first electrode 131 is connected to the conductive pad.

A second part of the light shielding layer 121, a second part of the active layer 123, and a part of the second metal layer 127 are spaced apart and are overlapped with each other.

It should be noted that the structure of the thin film transistor with a top-gate structure is illustrated in the display panel 100 of this embodiment, but the present application is not limited thereto, for example, it may also be a structure of a bottom gate thin film transistor or a double-gate thin film transistor.

Optionally, materials of the block portion u2 and the wiring layer 128 are same. The material of the wiring layer 128 can be metal, metal alloy, or metal oxide, etc., for example, a single layer structure of molybdenum (Mo), titanium (Ti), or an alloy of Mo and Ti, and can also be a multi-layer structure of Mo/Al/Mo, Al/Mo, Mo/Cu/Mo, MoTi/Cu/MoTi, Ti/Cu/Ti, or Ti/Al/Ti, etc.

Optionally, an material of the active layer 123 can be metal oxide semiconductor, or polycrystalline silicon, etc.

In some embodiments, the materials of the block portion u2 and the wiring layer 128 can be different.

Optionally, a thickness of the passivation layer Pv ranges from 1 μm to 4 μm, for example, 1 μm, 2 μm, 3 μm, or 4 μm.

Optionally, a thickness of the planarization layer Pln ranges from 1 μm to 5 μm, for example, 1 μm, 2 μm, 3 μm, 4 μm, or 5 μm.

Of course, in some embodiments, the auxiliary electrode Fd and the second metal layer 127 can be formed in different steps, and the support portion u1 and the passivation layer Pv can also be formed in different steps.

In this embodiment, the first electrode 131 is an anode, and the second electrode 134 is a cathode, but is not limited thereto.

A material of the light-emitting layer 133 can be an organic material or an inorganic material.

A second opening 13a is defined in the pixel definition layer 132. The second opening 13a is defined on the first opening 12a and communicates with the first opening 12a.

Figure 4:
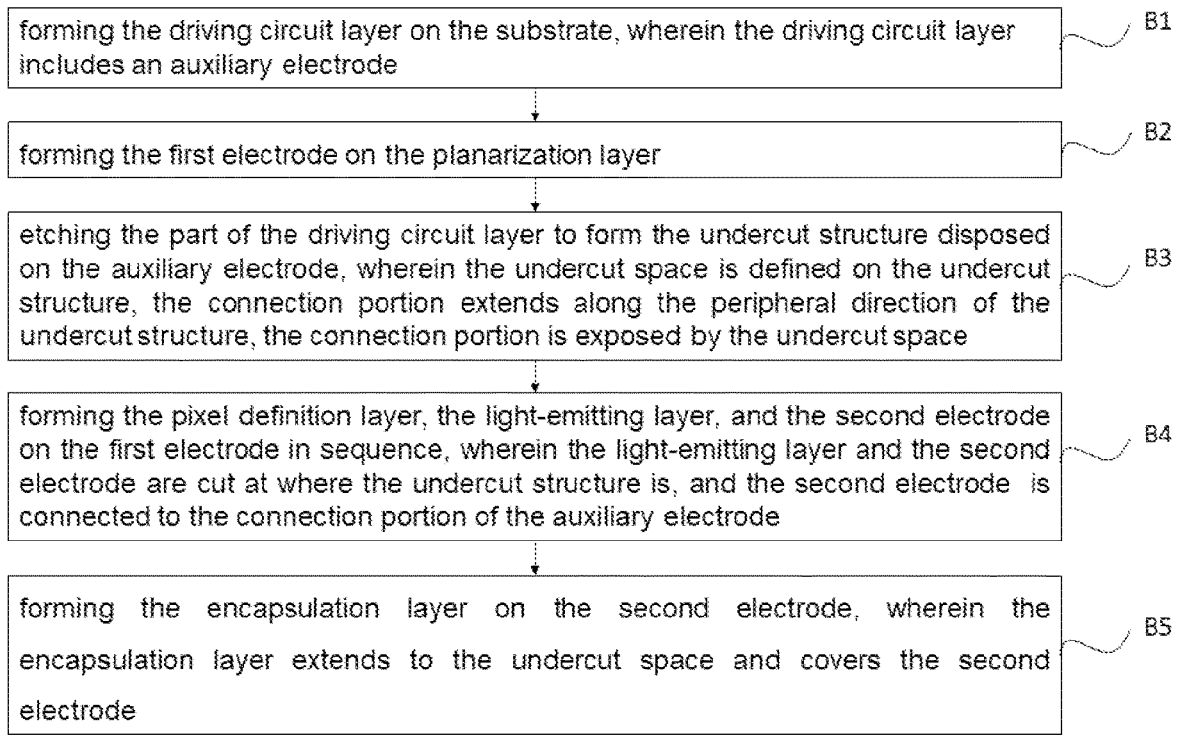
FIG. 4 is a flowchart of a manufacturing method of the display panel provided by one embodiment of the present application.

Correspondingly, please refer to FIG. 4, one embodiment of the present application further provides a manufacturing method of the display panel, which includes following steps:

Step B1: forming a driving circuit layer on a substrate, wherein the driving circuit layer includes an auxiliary electrode;

Step B2: forming a first electrode on the driving circuit layer;

Step B3: etching a part of the driving circuit layer to form an undercut structure disposed on the auxiliary electrode, wherein an undercut space is defined on the undercut structure, the auxiliary electrode includes a connection portion, the connection portion extends along a peripheral direction of the undercut structure, and the connection portion is exposed by the undercut space;

Step B4: forming a light-emitting layer and a second electrode on the first electrode in sequence, wherein the light-emitting layer and the second electrode are cut at where the undercut structure is, and the second electrode is connected to the connection portion of the auxiliary electrode; and Step B5: forming an encapsulation layer on the second electrode, wherein the encapsulation layer extends into the undercut space and covers the second electrode.

In the manufacturing method of the display panel of the embodiments of the present application, an island-type undercut structure is adopted to replace a hole-type undercut structure in the prior art. Specifically, as the undercut structure is disposed at middle of the auxiliary electrode, the undercut structure is located in the opening, and a slope of the surrounding hole wall is continuous, the hole wall has no protrusion portion in the prior art. When the encapsulation layer is manufactured, the encapsulation layer can completely cover the whole hole wall, can extend into the undercut space, and can cover the second electrode and the light-emitting layer in the undercut space, thereby improving the encapsulation effect of the encapsulation layer. Therefore, the encapsulation effect of the display panel is improved.

The manufacturing method of the display panel is described hereinafter.

In step B1, the driving circuit layer 12 is formed on the substrate 11. Specifically, the step B1 includes following steps.

Figure 5:
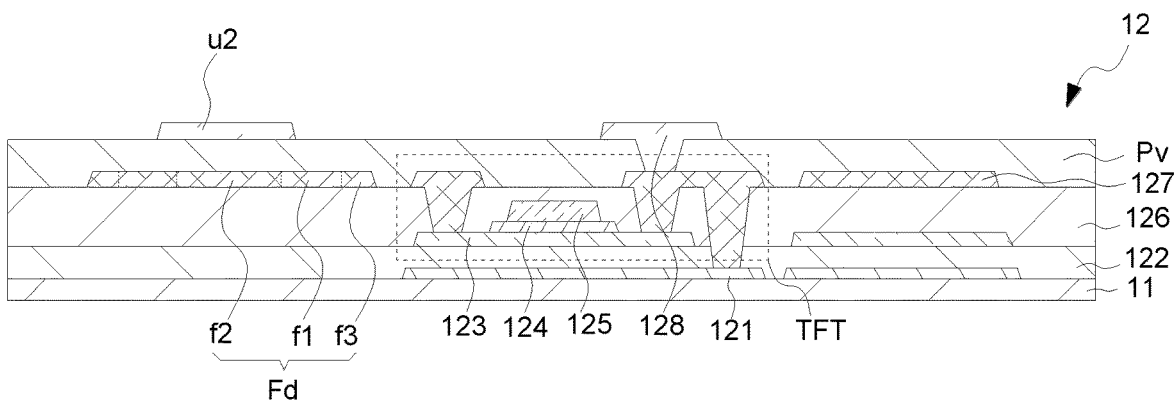
FIG. 5 is a schematic diagram of step B11 to step B13 of the manufacturing method of the display panel provided by one embodiment of the present application.

Please refer to FIG. 5, in step B11, a thin film transistor TFT and an auxiliary electrode Fd are formed on the substrate 11. The auxiliary electrode Fd further includes a connection portion f1 and a carrier portion f2. The connection portion f1 is connected on a peripheral side of the carrier portion f2.

Optionally, the substrate 11 can be a rigid substrate or a flexible base. A material of the substrate 11 includes one of glass, sapphire, silicon, silicon dioxide, polyethylene, polypropylene, polystyrene, poly(lactic acid), polyethylene terephthalate, polyimide, or polyurethane.

Optionally, the thin film transistor TFT can be a top-gate type thin film transistor, a bottom-gate type thin film transistor, or a double-gate type thin film transistor. In this embodiment, the top-gate structure is taken as an example, but it is not limited thereto. The structures of bottom-gate or double-gate thin film transistors are the prior art, and redundant description will not be mentioned herein.

Optionally, the driving circuit layer 12 further includes a light shielding layer 121, a first insulation layer 122, an active layer 123, a second insulation layer 124, a first metal layer 125, a third insulation layer 126, a second metal layer 127, and a wiring layer 128 disposed on the substrate 11.

The auxiliary electrode Fd is formed in the second metal layer 127, which can achieve an effect of saving steps and processes.

The auxiliary electrode Fd includes the connection portion f1. The auxiliary electrode Fd further includes a carrier portion f2. The connection portion f1 is disposed on a peripheral side of the carrier portion f2.

In this embodiment, the first metal layer 125 includes a gate electrode. The second metal layer 127 further includes a source electrode and a drain electrode. The first part of the active layer 123, the gate electrode, the source electrode, and the drain electrode form the thin film transistor. The source electrode is connected to a first part of a light shielding layer 121 by another via hole. The first part of the light shielding layer 121 shields the active layer 123. A second part of the light shielding layer 121, a second part of the active layer 123, and a part of the second metal layer 127 are spaced apart and are overlapped with each other.

Optionally, an material of the active layer 123 can be metal oxide semiconductor, or polycrystalline silicon, etc.

Optionally, materials of the auxiliary electrode Fd and the second metal layer 127 can be same. The material of the second metal layer 127 can be metal, metal alloy, or metal oxide, etc., Please refer to FIG. 5, in step B12, the passivation layer Pv is formed on the auxiliary electrode Fd.

Optionally, the material of the passivation layer Pv can include at least one of silicon nitride, silicon oxide, or organic photoresist.

A thickness of the passivation layer Pv ranges from 1 μm to 4 μm, for example, 11 μm, 2 μm, 3 μm, or 4 μm.

Please refer to FIG. 5, in step B13, the block portion u2 is formed on the passivation layer Pv, i.e., the wiring layer 128 is formed on the passivation layer Pv. The wiring layer 128 includes the block portion u2 and the conductive pad. The conductive pad is connected to the source electrode of the thin film transistor through a via hole.

Optionally, materials of the block portion u2 and the wiring layer 128 are same. The material of the second metal layer 127 can be metal, metal alloy, or metal oxide, etc., for example, a single layer structure of molybdenum (Mo), titanium (Ti), or an alloy of Mo and Ti, and can also be a multi-layer structure of Mo/Al/Mo, Al/Mo, Mo/Cu/Mo, MoTi/Cu/MoTi, Ti/Cu/Ti, or Ti/Al/Ti.

In some embodiments, the materials of the block portion u2 and the wiring layer 128 can be different.

Figure 6:
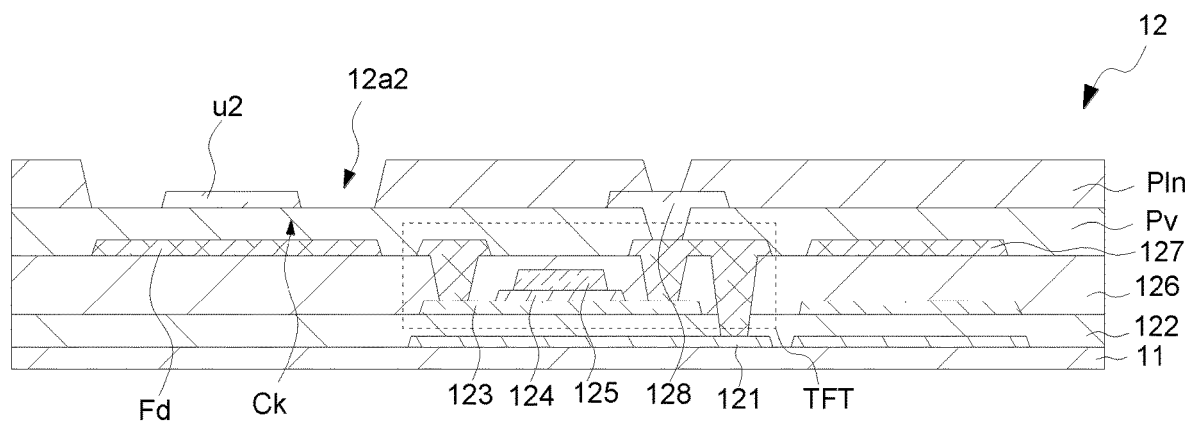
FIG. 6 is a schematic diagram of step B14 of the manufacturing method of the display panel provided by one embodiment of the present application.

Please refer to FIG. 6, in step B14, the planarization layer Pln is formed on the block portion u2. The second branch hole 12a2 is defined in the planarization layer Pln, and the block portion u2 is exposed by the second branch hole 12a2.

Optionally, a thickness of the planarization layer Pln ranges from 1 μm to 5 μm, for example, 1 μm, 2 μm, 3 μm, 4 μm, or 5 μm.

Optionally, a material of the planarization layer Pln can be an organic transparent film layer, for example, transparent photoresist, epoxy resin, polyimide, polyvinyl alcohol, polymethyl methacrylate, polystyrene, etc.

Then, go to step B2.

Figure 7:
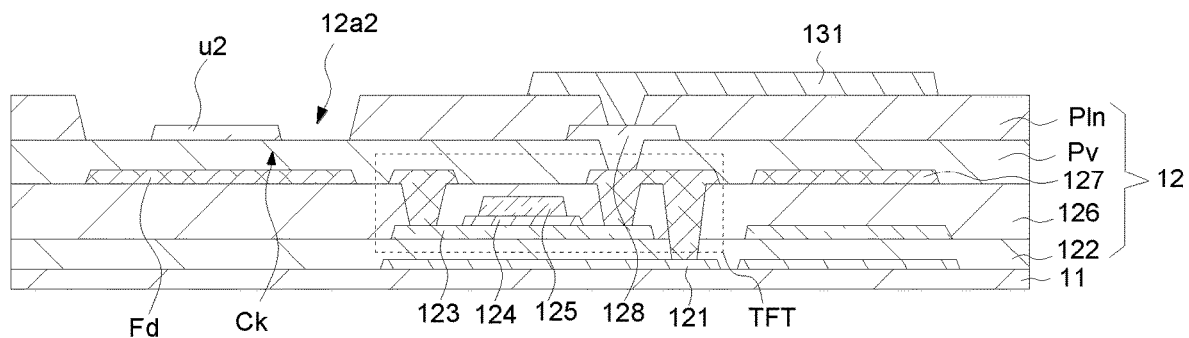
FIG. 7 is a schematic diagram of step B2 of the manufacturing method of the display panel provided by one embodiment of the present application.

Please refer to FIG. 7, in step B2, the first electrode 131 is formed on the planarization layer Pln.

Optionally, the first electrode 131 can be an anode, which includes a metal material having high reflectivity, for example, includes but is not limited to indium tin oxide/silver/indium tin oxide (ITO/Ag/ITO), indium zinc oxide/silver/indium zinc oxide (IZO/Ag/IZO), ITO/aluminum (Al)/ITO, or IZO/Al/IZO etc.

The first electrode 131 is connected to the conductive pad by using a via hole.

Then, go to step B3.

In the step B3, the part of the driving circuit layer 12 is etched to form the undercut structure Uc disposed on the auxiliary electrode Fd. The undercut space Ck is defined on the undercut structure Uc. The connection portion f1 extends along the peripheral direction of the undercut structure Uc. The connection portion f1 is exposed by the undercut space Ck.

Specifically, the step B3 includes following steps.

Figure 8:
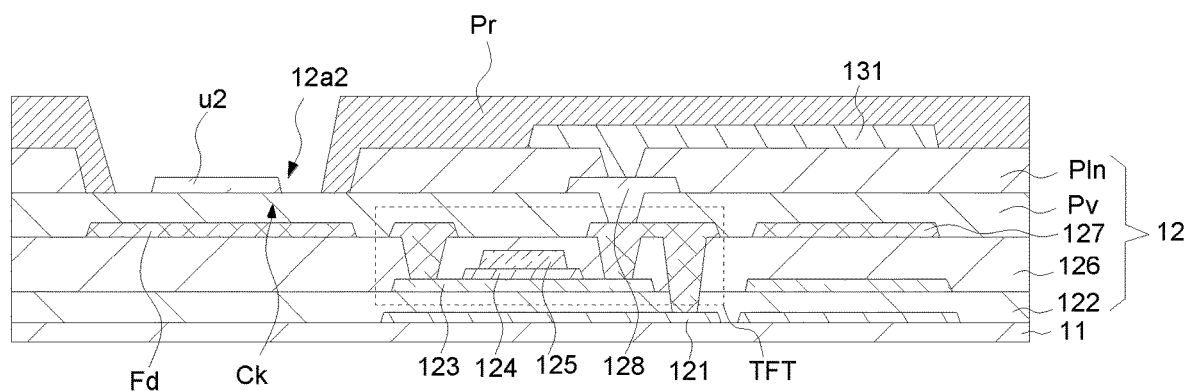
FIG. 8 is a schematic diagram of step B31 of the manufacturing method of the display panel provided by one embodiment of the present application.

Please refer to FIG. 8, in step B31, the photoresist layer Pr is formed on the planarization layer Pln. The photoresist layer Pr covers a hole wall of the second branch hole 12a2 and exposes part of the block portion u2 and the passivation layer Pv.

Optionally, a distance from the block portion u2 to the photoresist layer Pr is greater than or equal to 5 μm, for example, 5 μm, 6 μm, 7 μm, or 8 μm, etc.

Figure 9:
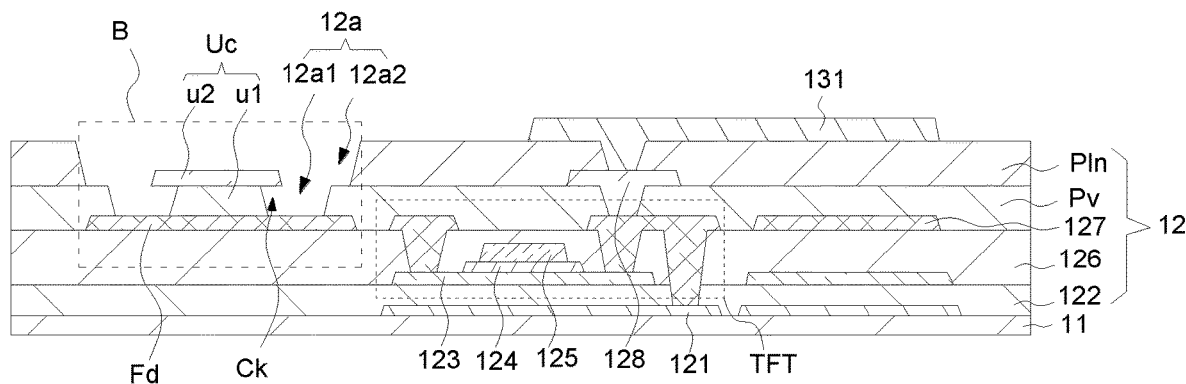
FIG. 9 is a schematic diagram of step B32 to step B33 of the manufacturing method of the display panel provided by one embodiment of the present application.

Please refer to FIG. 9, in the step B32, the exposed passivation layer Pv is etched to form the undercut structure Uc and the first branch hole 12a1.

The undercut structure Uc includes the block portion u2, and the support portion u1 formed in the passivation layer Pv. The support portion u1 is disposed on the carrier portion f2. The block portion u2 includes the connection part u21 and the hanged part u22 connected to the connection part u21. The connection part u21 is disposed on the support portion u1. The hanged part u22 protrudes out from the support portion u1. Lateral surfaces of the hanged part u22 and the support portion u1 form the undercut space Ck.

Figure 10:
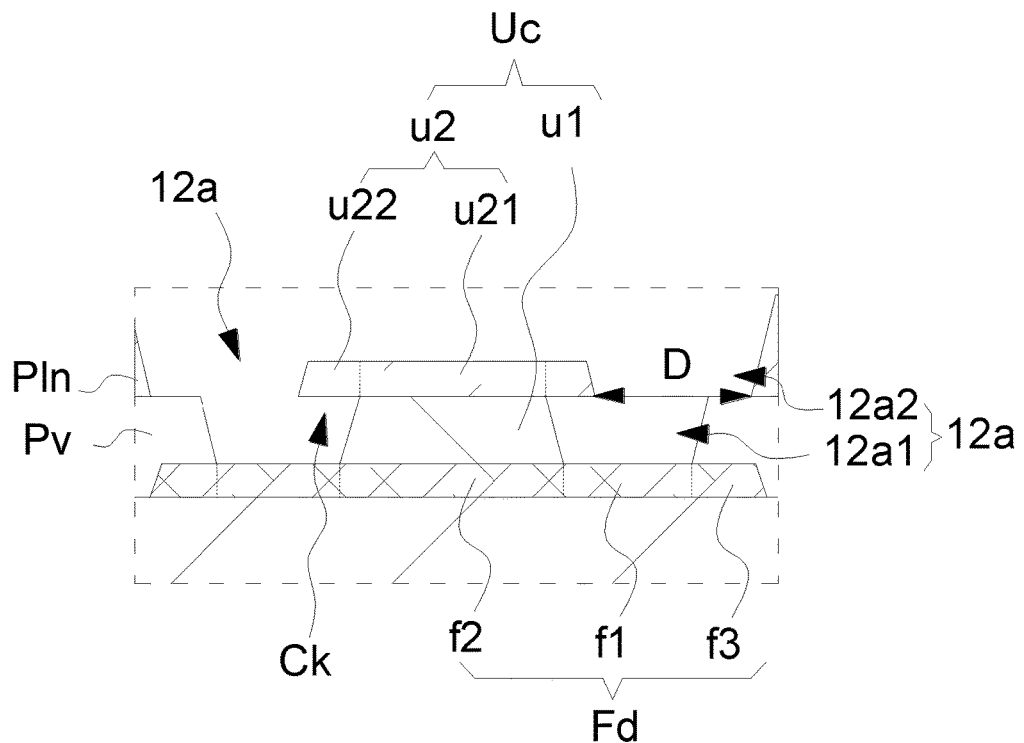
FIG. 10 is a schematic diagram of an enlargement of part B in FIG. 9.

Please refer to FIG. 9 and FIG. 10, in step B33, the photoresist layer Pr is removed to form the second branch hole 12a2.

The first opening 12a is defined in the driving circuit layer 12. The undercut structure Uc is disposed in the first opening 12a. The first opening 12a includes a first branch hole 12a1 and a second branch hole 12a2 communicated with each other. The first branch hole 12a1 is formed in the passivation layer Pv. The second branch hole 12a2 is formed in the planarization layer Pln. A hole wall of the second branch hole 12a2 is located at a periphery of a hole wall of the first branch hole 12a1.

The connection portion f1 extends along the peripheral direction of the undercut structure Uc. The connection portion f1 is exposed by the undercut space Ck.

The auxiliary electrode Fd further includes a peripheral portion f3, and the peripheral portion f3 is connected on a peripheral side of the connection portion f1. The passivation layer Pv covers the peripheral portion f3.

A width of the connection portion f1 is greater than or equal to 4 μm. A distance D from the block portion u2 to the hole wall of the second branch hole 12a2 is greater than or equal to 6 μm.

Optionally, the width of the connection portion f1 can be 4 μm, 5 μm, 6 μm, 8 μm, or 10 μm, etc., and the distance from the block portion u2 to the hole wall of the second branch hole 12a2 can be 6 μm, 8 μm, 10 μm, 15 μm or 20 μm, etc.

Optionally, a thickness of the support portion u1 ranges from 1400 angstroms to 5100 angstroms, for example, 1400 angstroms, 1500 angstroms, 2000 angstroms, 2500 angstroms, 4000 angstroms, 5000 angstroms, or 5100 angstroms.

Optionally, the undercut space Ck extends along a peripheral direction of the support portion u1 to form a ring shape. In this way, the encapsulation effect of the encapsulation layer 14 in subsequent processes is improved.

In some embodiments, undercut structures Ck can be disposed on opposite sides of the undercut structure Uc, i.e., the undercut spaces Ck extend along the two sides of the periphery of the support portion u1 to form two isolated undercut spaces Ck.

Then, go to step B4.

In the step B4, the pixel definition layer 132, the light-emitting layer 331, and the second electrode 134 are formed on the first electrode 131 in sequence. The light-emitting layer 133 and the second electrode 134 are cut at where the undercut structure Uc is. The second electrode 134 is connected to the connection portion f1 of the auxiliary electrode Fd. The step B4 includes following steps.

Figure 11:
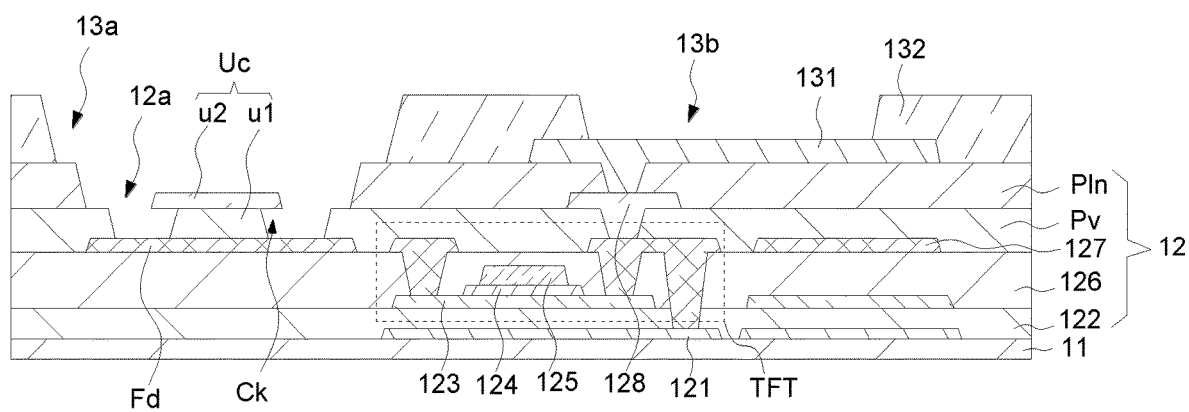
FIG. 11 is a schematic diagram of step B41 of the manufacturing method of the display panel provided by one embodiment of the present application.

Please refer to FIG. 11, in step B41, the pixel definition layer 132 is formed on the first electrode 131.

A second opening 13a is defined in the pixel definition layer 132. The second opening 13a is defined on the first opening 12a and communicates with the first opening 12a. A third opening 13b is defined in the pixel definition layer 132. The first electrode 131 is exposed by the third opening 13b.

Figure 12:
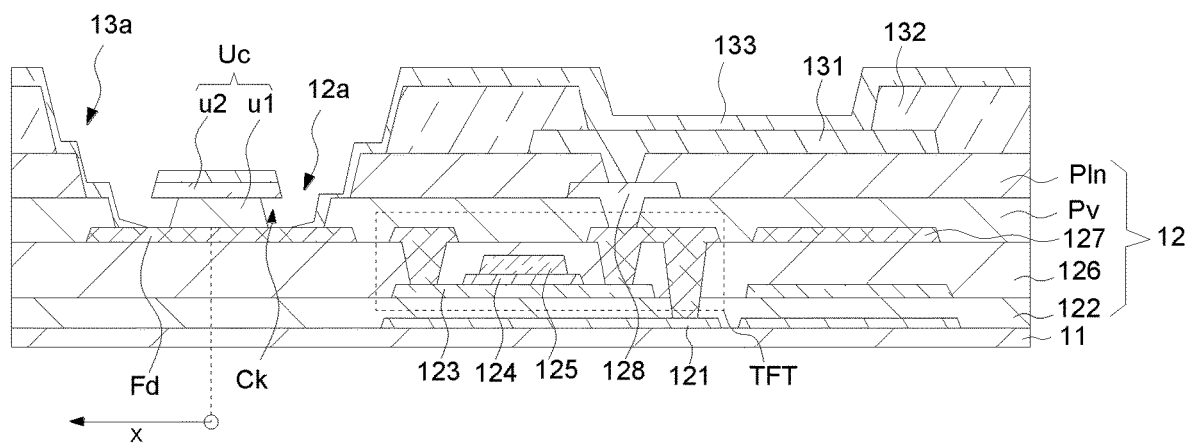
FIG. 12 is a schematic diagram of step B42 of the manufacturing method of the display panel provided by one embodiment of the present application.

Please refer to FIG. 12, in step B42, the light-emitting layer 133 is formed on the first electrode 131.

The light-emitting layer 133 covers the first electrode 131 and the pixel definition layer 132. The light-emitting layer 133 further covers hole walls of the first opening 12a and the second opening 13a and is disposed in the third opening 13b. The light-emitting layer 133 is broken at the undercut structure Uc. Wherein, a part of the light-emitting layer 133 is further disposed on the undercut structure Uc.

In this embodiment, by a vapor deposition angle of the light-emitting layer 133, the light-emitting layer 133 cannot completely cover the auxiliary electrode Fd below.

A thickness of the light-emitting layer 133 gradually increases in the direction X from the support portion u1 toward the hole wall of the first opening 12a in the undercut space Ck. In other words, as the light-emitting layer 133 enters into the undercut space Ck deeper, the thickness of the light-emitting layer 133 decreases, thereby facilitating the second electrode 134 of subsequent processes to enter the space deep in the undercut space Ck, and increasing an area of the second electrode 134 connected to the auxiliary electrode Fd.

Optionally, the light-emitting layer 133 can be an organic material.

Figure 13:
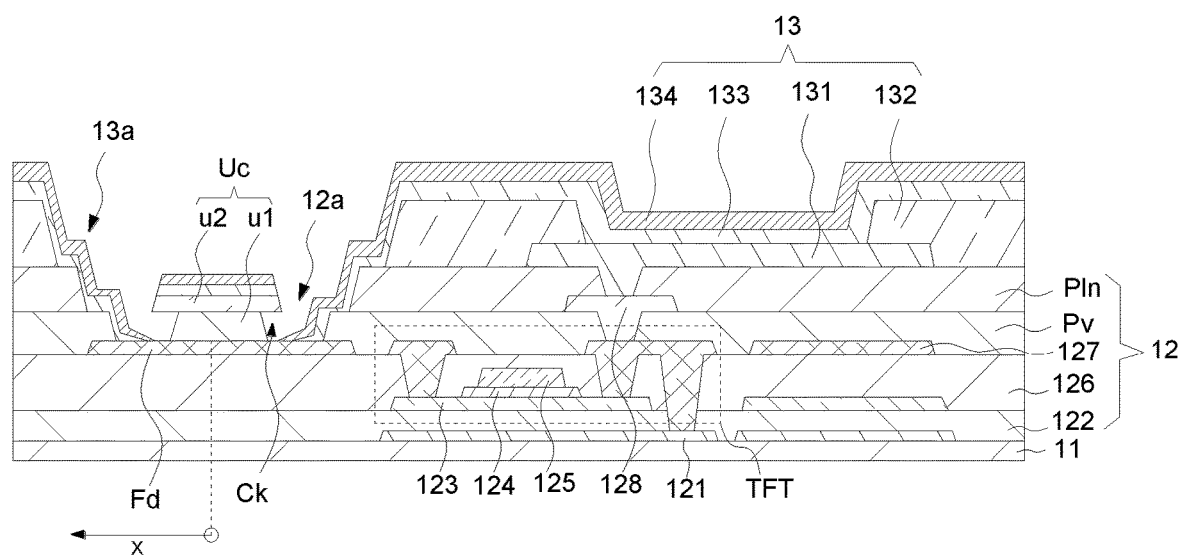
FIG. 13 is a schematic diagram of step B43 of the manufacturing method of the display panel provided by one embodiment of the present application.
Figure 14:
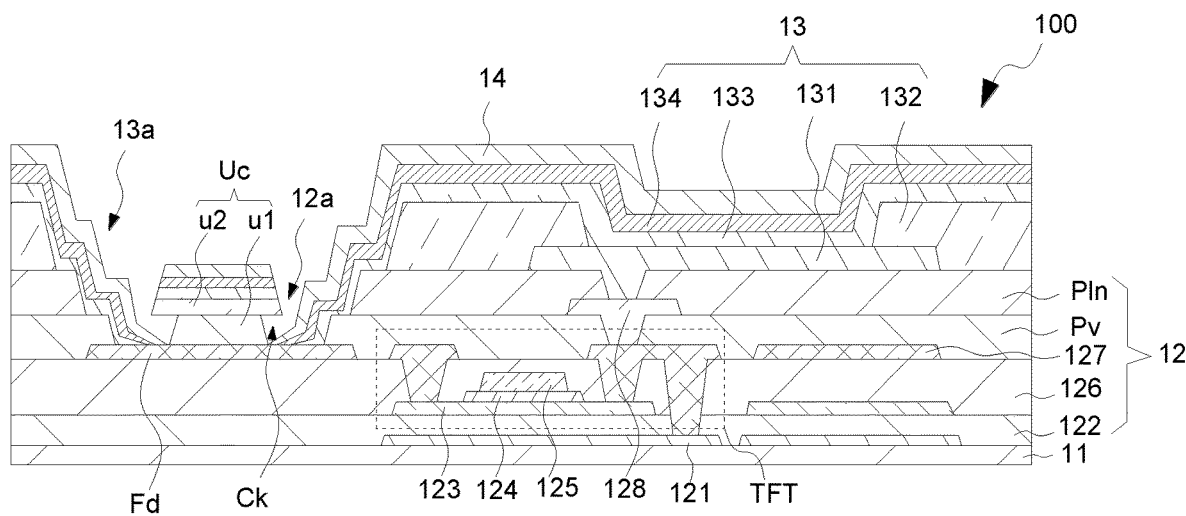
FIG. 14 is a schematic diagram of step B5 of the manufacturing method of the display panel provided by one embodiment of the present application.

Please refer to FIG. 13, in step B43, the second electrode 134 is formed on the light-emitting layer 133.

Optionally, the first electrode 131, the pixel definition layer 132, the light-emitting layer 133, and the second electrode 134 form the light-emitting device layer 13. It should be noted that the light-emitting device layer 13 includes but is not limited to the first electrode 131, the pixel definition layer 132, the light-emitting layer 133, and the second electrode 134, for example, an electron transport layer, a hole transport layer, etc. can be included.

The second electrode 134 is disposed on the light-emitting layer 133, and the second electrode 134 is broken at where the undercut structure Uc is. Wherein, a part of the second electrode 134 is also disposed on the undercut structure Uc.

The second electrode 134 extends into the undercut space Uc. A thickness of the second electrode 134 gradually increases in a direction X from the support portion u1 toward a hole wall of the first opening 12a in the undercut space Ck. In other words, as the second electrode 134 enters into the undercut space Ck deeper, the thickness of the second electrode 134 decreases, thereby facilitating the encapsulation layer 14 of subsequent processes to enter a space deep in the undercut space Ck, and increasing a probability that the encapsulation layer 14 covers the second electrode 134.

Then, go to step B5.

Please refer to FIG. 15, in step B5, the encapsulation layer 14 is formed on the second electrode 134.

Optionally, the encapsulation layer 14 covers the second electrode 134 located in the undercut space Ck, and the second electrode 134 covers the light-emitting layer 133 located in the undercut space Ck.

In this way, the manufacturing processes of the display panel 100 of this embodiment is finished.

The island-type undercut structure is adopted to replace a hole-type undercut structure in the prior art in the manufacturing method of the display panel of the embodiments of the present application, thereby improving encapsulation effect of the display panel.

Specifically, the display panel includes the driving circuit layer, the light-emitting layer, and the encapsulation layer. The driving circuit layer includes the auxiliary electrode and the undercut structure disposed on the auxiliary electrode. The undercut space is defined on the undercut structure. The auxiliary electrode includes the connection portion. The connection portion extends along the peripheral direction of the undercut structure. The connection portion is exposed by the undercut space. The light-emitting device layer includes the light-emitting layer and the second electrode. The light-emitting layer and the second electrode are cut at where the undercut structure is. The second electrode is connected to the connection portion of the auxiliary electrode. The encapsulation layer extends into the undercut space and covers the second electrode. Because the encapsulation layer can extend into the undercut space and can cover the second electrode and the light-emitting layer in the undercut space, the encapsulation effect of the encapsulation layer is improved.

The display panel and manufacturing method thereof provided by the embodiments of the present application are described in detail above. This article uses specific cases for describing the principles and the embodiments of the present application, and the description of the embodiments mentioned above is only for helping to understand the method and the core idea of the present application. Meanwhile, for those skilled in the art, will have various changes in specific embodiments and application scopes according to the idea of the present application. In summary, the content of the specification should not be understood as limit to the present application.

What is claimed is:

1. A display panel, comprising:
   a substrate;
   a driving circuit layer, wherein the driving circuit layer is disposed on the substrate, the driving circuit layer comprises an auxiliary electrode and an undercut structure disposed on the auxiliary electrode, an undercut space is defined on the undercut structure, the auxiliary electrode comprises a connection portion, the connection portion extends along a peripheral direction of the undercut structure, and the connection portion is exposed by the undercut space;
   a first electrode, wherein the first electrode is disposed on the driving circuit layer, the first electrode is a reflective electrode;
   a light-emitting layer and a second electrode, wherein the light-emitting layer is disposed on the first electrode, the second electrode is disposed on the light-emitting layer, the light-emitting layer and the second electrode are cut at where the undercut structure is, and the second electrode is connected to the connection portion of the auxiliary electrode; and
   an encapsulation layer, wherein the encapsulation layer covers the second electrode, and the encapsulation layer extends into the undercut space and covers the second electrode;
   wherein the undercut structure comprises a support portion and a block portion, the auxiliary electrode comprises a carrier portion, the connection portion is connected on a peripheral side of the carrier portion, the support portion is disposed on the carrier portion, the block portion comprises a connection part and a hanged part connected to the connection part, the connection part is disposed on the support portion, the hanged part protrudes out from the support portion, and lateral surfaces of the hanged part and the support portion form the undercut space;
   a first opening is defined in the driving circuit layer, and the undercut structure is disposed in the first opening, a thickness of the second electrode gradually increases in a direction from the support portion toward a hole wall of the first opening in the undercut space; and
   the driving circuit layer comprises a passivation layer disposed on the substrate and a planarization layer disposed on the passivation layer, the auxiliary electrode comprises a peripheral portion, the peripheral portion is connected on a peripheral side of the connection portion, the passivation layer covers the peripheral portion, the first opening comprises a first branch hole and a second branch hole communicated with each other, the first branch hole is defined in the passivation layer, the second branch hole is defined in the planarization layer, a hole wall of the second branch hole is located at a periphery of a hole wall of the first branch hole; a width of the connection portion is greater than or equal to 4 μm, and a distance from the block portion to the hole wall of the second branch hole is greater than or equal to 6 μm.

2. The display panel as claimed in claim 1, wherein the undercut space extends along a peripheral direction of the support portion to form a ring shape.

3. The display panel as claimed in claim 1, wherein the driving circuit layer comprises a light shielding layer, a first insulation layer, an active layer, a second insulation layer, a first metal layer, a third insulation layer, a second metal layer, and a wiring layer disposed on the substrate,
the passivation layer is disposed on the second metal layer, the auxiliary electrode is formed in the second metal layer, the support portion is formed in the passivation layer, the block layer is formed in the wiring layer, and the planarization layer is disposed on the wiring layer.

4. A display panel, comprising:
a substrate;
a driving circuit layer, wherein the driving circuit layer is disposed on the substrate, the driving circuit layer comprises an auxiliary electrode and an undercut structure disposed on the auxiliary electrode, an undercut space is defined on the undercut structure, the auxiliary electrode comprises a connection portion, the connection portion extends along a peripheral direction of the undercut structure, and the connection portion is exposed by the undercut space;
a first electrode, wherein the first electrode is disposed on the driving circuit layer;
a light-emitting layer and a second electrode, wherein the light-emitting layer is disposed on the first electrode, the second electrode is disposed on the light-emitting layer, the light-emitting layer and the second electrode are cut at where the undercut structure is, and the second electrode is connected to the connection portion of the auxiliary electrode; and
an encapsulation layer, wherein the encapsulation layer covers the second electrode, and the encapsulation layer extends into the undercut space and covers the second electrode;
wherein the undercut structure comprises a support portion and a block portion, the auxiliary electrode comprises a carrier portion, the connection portion is connected on a peripheral side of the carrier portion, the support portion is disposed on the carrier portion, the block portion comprises a connection part and a hanged part connected to the connection part, the connection part is disposed on the support portion, the hanged part protrudes out from the support portion, and lateral surfaces of the hanged part and the support portion form the undercut space;
a first opening is defined in the driving circuit layer, and the undercut structure is disposed in the first opening, a thickness of the second electrode gradually increases in a direction from the support portion toward a hole wall of the first opening in the undercut space; and
the driving circuit layer comprises a passivation layer disposed on the substrate and a planarization layer disposed on the passivation layer, the auxiliary electrode comprises a peripheral portion, the peripheral portion is connected on a peripheral side of the connection portion, the passivation layer covers the peripheral portion, the first opening comprises a first branch hole and a second branch hole communicated with each other, the first branch hole is defined in the passivation layer, the second branch hole is defined in the planarization layer, a hole wall of the second branch hole is located at a periphery of a hole wall of the first branch hole; a width of the connection portion is greater than or equal to 4 µm, and a distance from the block portion to the hole wall of the second branch hole is greater than or equal to 6 µm.

5. The display panel as claimed in claim 4, wherein the undercut space extends along a peripheral direction of the support portion to form a ring shape.

6. The display panel as claimed in claim 4, wherein the driving circuit layer comprises a light shielding layer, a first insulation layer, an active layer, a second insulation layer, a first metal layer, a third insulation layer, a second metal layer, and a wiring layer disposed on the substrate,
the passivation layer is disposed on the second metal layer, the auxiliary electrode is formed in the second metal layer, the support portion is formed in the passivation layer, the block layer is formed in the wiring layer, and the planarization layer is disposed on the wiring layer.

* * * * *